United States Patent [19]
Leicht

[11] Patent Number: 5,181,648
[45] Date of Patent: Jan. 26, 1993

[54] METHOD AND APPARATUS FOR VAPOR PHASE SOLDERING AND CLEANING PRODUCTS

[76] Inventor: Helmut W. Leicht, Messerschmittring 61, 8901 Königsbrunn, Fed. Rep. of Germany

[21] Appl. No.: 687,893
[22] PCT Filed: Nov. 28, 1989
[86] PCT No.: PCT/EP89/01442
§ 371 Date: Jun. 12, 1991
§ 102(e) Date: Jun. 12, 1991
[87] PCT Pub. No.: WO90/06203
PCT Pub. Date: Jun. 14, 1990

[30] Foreign Application Priority Data
Nov. 28, 1988 [DE] Fed. Rep. of Germany ....... 3840098

[51] Int. Cl.⁵ .............................................. H05K 3/34
[52] U.S. Cl. ................... 228/201; 228/240; 432/66; 432/197
[58] Field of Search ............... 228/201, 180.1, 180.2, 228/240, 242, 42; 432/66, 197

[56] References Cited

U.S. PATENT DOCUMENTS

| | | | |
|---|---|---|---|
| 3,724,418 | 4/1973 | McLain | 228/37 X |
| 4,022,371 | 5/1977 | Skarvinko et al. | 228/223 |
| 4,032,033 | 6/1977 | Chu et al. | 228/201 X |
| 4,321,031 | 3/1982 | Woodgate | 219/388 X |
| 4,389,797 | 6/1983 | Spigarelli et al. | 34/73 |
| 4,589,926 | 5/1986 | Holmstrand | 134/902 |
| 4,612,712 | 9/1986 | Pescotore et al. | 228/240 |

FOREIGN PATENT DOCUMENTS
2159084 11/1985 United Kingdom ............... 228/201

OTHER PUBLICATIONS

Research Disclosure, No. 304, Aug. 1989, "Solder Cooling Technique" p. 304-37 by Kenneth Mason Publications Ltd., England.

Primary Examiner—Kenneth J. Ramsey
Attorney, Agent, or Firm—Parmelee, Bollinger & Bramblett

[57] ABSTRACT

The described cleaning of work pieces, in particular printed circuit boards or assemblies, after the soldering, is performed by washing with an inert cleansing fluid which is maintained at a temperature slightly below the melting point of the solder. As a result, solvents for dissolving the impurities and soldering fluxes which are harmful to the environment can be dispensed with. This cleaning is particularly advantageous subsequent to the vapor phase soldering since the same fluid can be used for the cleansing fluid as for the heat transfer medium in the vapor phase soldering apparatus. Therefore, the problem of an unwanted mixing of different treatment media (on the one hand heat transfer medium and on the other hand cleansing fluid) does not arise.

29 Claims, 1 Drawing Sheet

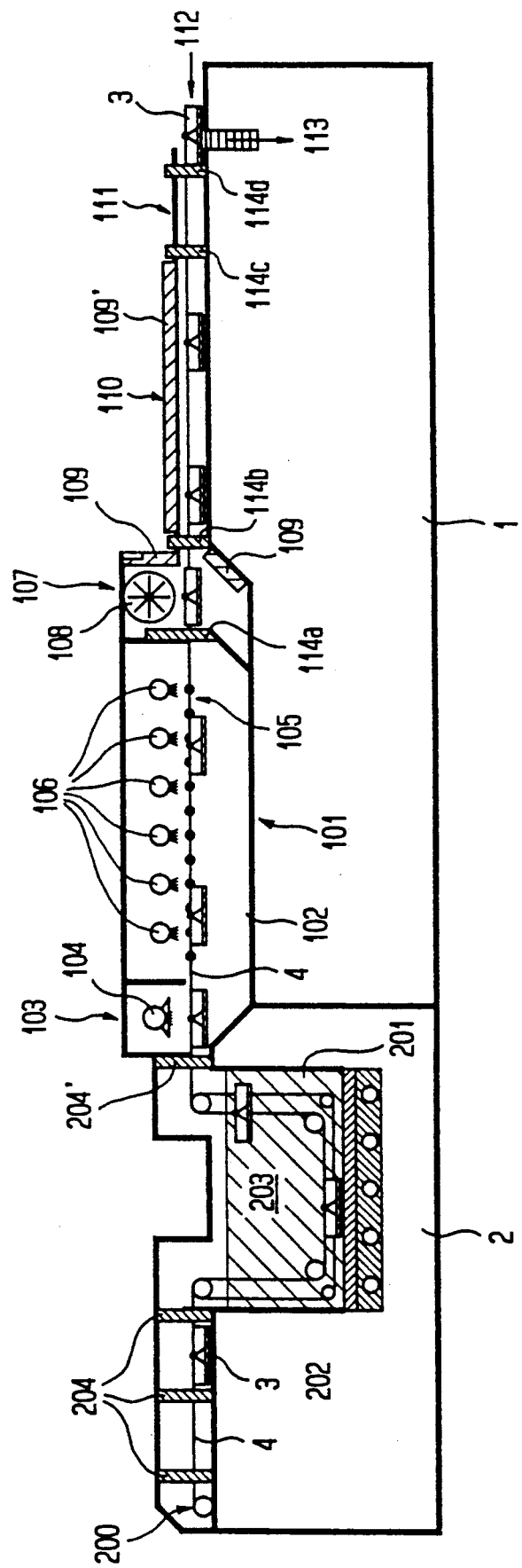

METHOD AND APPARATUS FOR VAPOR PHASE SOLDERING AND CLEANING PRODUCTS

The invention relates to a method and an apparatus for removing solder residues from products, in particular from printed-board assemblies or circuit modules after the vapor phase soldering.

Although the invention is described in the following mainly as aftertreatment in connection with the vapor phase soldering of electronic components on printed circuit boards, the invention is not restricted thereto. The vapor phase soldering is the preferred field of application, but it is also possible to apply the cleaning measures according to the invention generally to differently pretreated soldered products.

The U.S. Pat. No. 3,724,418 discloses a soldering apparatus in which the water soluble solder residues can be removed from the soldered circuit boards by means of a hot water spray.

The German Offenlegungsschrift 30 06 045 discloses a method for cleaning flat products, such as printed circuit boards and flat circuit modules. According to this publication, the products are preferably upright and continuously transported through a chamber in horizontal direction, the cleansing fluid being simultaneously sprayed from both sides onto the surface of the products to be cleaned by spray nozzles which are disposed on both sides. In this connection, it is the task of the fluid jets to guide the flat products on the transport path as well as to clean them by dissolving and rinsing the impurities. The used cleansing fluid dissolves the impurities.

The German Offenlegungsschrift 30 28 325 discloses a method for cleaning printed circuit boards wherein the substances to be removed, such as soldering fluxes, are also eliminated by a cleansing fluid spray. The German Offenlegungsschrift describes various measures, such as direction, pressure and speed of the cleansing fluid jets, in order to remove impurities also from relatively inaccessible areas.

The German Offenlegungsschrift 34 22 562 discloses a further method for cleaning printed circuit boards after the soldering. The impurities are first removed by washing and brushing using a liquid solvent. Thereafter the thus cleaned printed circuit boards are dried. The used solvent is cleaned in a distilling apparatus and then used again as solvent in a closed cycle.

The various previously known methods have in common that the cleansing fluid dissolves the impurities to be removed, such as soldering fluxes. As a result, the cleansing fluid which leaves the cleaning step is charged with the impurities. Therefore, if the reuse of the cleansing fluid is desired, it must be cleaned before it can be employed again for the actual cleaning of the printed circuit boards. In addition, the cleaning of circuit boards with such cleansing fluids causes substantial problems particularly in the case of printed circuit boards with a high component density. This can also be taken from the above mentioned publications. This problem has recently been further aggravated by the fact that the increasingly used surface mounted devices (SMD) are in very close contact to the printed circuit board and the connections are in many cases soldered to the printed circuit board directly below the actual component. This narrow space makes it extremely difficult, if not impossible, to transport the conventionally used cleansing fluid to the soldering joints in sufficient quantity to dissolve the impurities and to carry the fluid off as fast as possible. This problem has so far been solved by using very strong and thus aggressive cleansing fluids which in turn attack the components and the printed circuit boards in an unacceptable manner. The fluorocarbons used in known cleaning devices escape during operation and are harmful to the environment.

A further problem would arise if the known cleaning apparatuses were operated immediately after the vapor phase soldering apparatuses. If these two devices are successively operated in a continuous operation, a certain amount of the heat transfer medium is carried over from the vapor phase soldering apparatus to the cleaning apparatus when the assemblies are fed into the latter and is mixed with the cleansing fluid. This additional pollution of the cleansing fluid would make additional cleaning measures necessary. In addition, the losses of the relatively expensive heat transfer medium emitted from the vapor phase soldering apparatus would be substantial.

It is known from German Offenlegungsschrift 35 18 405 to remove or level possible excess solder still in liquid form by spraying the vapor phase medium onto it during the vapor phase soldering after the application of the solder.

Due to the fact that the solder is still liquid, there is the risk of the components being displaced by the spraying. Said publication does not mention the removal of solder residues, i.e. after the solder has solidified.

In contrast to this, the object underlying the present invention is to provide a method and an apparatus for removing solder residues from products, in particular from printed and soldered circuit boards or assemblies after the soldering process. In this connection, the use of solvents can be substantially dispensed with.

This object is achieved with the features of the claims.

The solution according to the invention is based on the idea to refrain as far as possible from using solvents during the cleaning. Instead, a heated cleansing fluid is used whose temperature in the cleaning step is maintained below the melting point of the materials not to be removed, e.g. the solder. The temperature of the cleansing fluid in the cleaning step is preferably only slightly below the melting point of the material to be removed. Consequently, the impurities to be removed, such as the soldering flux, are not dissolved in a solvent in the conventional manner but liquefied or maintained in liquid form by the heated cleansing fluid and rinsed by the cleansing fluid. The melting point of conventionally used solder is 183° C., hence the temperature of the cleansing fluid is maintained within a range from 150° C. to 180° C. A temperature of approximately 175° C. has proved to be particularly advantageous.

It is decisive that the temperature of the cleansing fluid in the cleaning step is selected in such a way that on the one hand it is so low that the material not to be removed is not molten and that on the other hand it is high enough to liquefy or maintain the material to be removed in liquid form.

The method according to the invention can be carried out in a particularly advantageous manner immediately subsequent to the soldering process, i.e. when the soldered joints are still heated. Particular advantages arise if the soldering is performed in a vapor phase soldering apparatus, for instance as in the German Patent Application P 38 14 870.6 of the said Applicant. In this case, the printed circuit boards which were treated in the vapor phase soldering apparatus at 215° C., for instance, can first be cooled in a controlled manner to a specified temperature (e.g. 175° C.) below the melting point of the solder (e.g. 183° C.) in a tempering means prior to spraying them with the heated cleansing fluid in the actual cleaning step. In this case, it is particularly advantageous to use the same fluid for the cleansing fluid as for the heat transfer medium in the vapor phase soldering apparatus, thereby ruling out the possibility of a mutual pollution of the heat transfer medium and the cleansing fluid. Consequently, an advantageous embodiment of this combination of vapor phase soldering apparatus and cleaning step is the use of a single treatment medium which is vaporous in the vapor phase soldering apparatus whereas it is sprayed below its boiling point and below the melting point of the solder in the cleaning step.

Further advantageous embodiments can be taken from the subclaims and the following explanation of the FIGURE.

The FIGURE shows a schematic view of a combination of a vapor phase soldering apparatus according to the invention and a cleaning apparatus according to the invention.

The shown complete apparatus consisting of vapor phase soldering apparatus 2 and cleaning apparatus 1 is designed as a continuous assembly, i.e. the products to be treated are conveyed on a continuous transport path 4 by means of work piece holders 3 from a feeding station 200 of the vapor phase soldering apparatus through the latter and then through the cleaning apparatus 1, to an output station 112. A possible vapor phase soldering apparatus 2 is described in detail in the German Patent Application P 38 14 870.6 of the same Applicant. The products to be treated are mounted onto work piece holders 3 in the feeding station 200 and transported via lock devices 204 through the treating chamber 201 of the vapor phase soldering apparatus 2 by a transport means 202. The vapor phase soldering treatment is carried out within the treating chamber 201 in a vapor phase region 203 which is maintained for instance at a temperature of 215° C. by means of the heat transfer medium. The thus treated (soldered) products, such as printed circuit boards, finally exit from the vapor phase soldering apparatus 2 via a lock device 204' and then immediately enter the directly connected cleaning apparatus 1 (from the left in the drawing). Said lock device 204' may be formed by a liquid curtain. In this connection, the same liquid is preferably used as the one used for the cleaning and optionally for the heat transfer. The "lock liquid" should at least be compatible with the two last mentioned liquids. The essential part of said cleaning apparatus 1 is the cleaning station 101 with the associated chamber housing 102. In said cleaning station 101, the soldered assemblies are sprayed with the inert cleansing fluid whose temperature is adjusted in such a way that it is slightly below the melting temperature of the solder. At this temperature, for instance 175° C., the impurities on the printed circuit board or the soldering joints, such as soldering flux constituents, are liquefied or maintained in liquid form and washed from the printed circuit board. Precision jet nozzles 106 are provided for forming the spray jets of the cleansing fluid. Said precision jet nozzles spray onto the printed circuit boards from different angles. In order to achieve the most optimum cleaning, several nozzles should be directed vertically to the printed circuit boards whereas other nozzles should emit the cleansing fluid from different angles up to practically horizontally. Due to this and the forming of very fine jets, the cleansing fluid also reaches areas of difficult access, for instance below SMD devices, and washes off the existing impurities at an increased temperature.

As shown in the drawing, a tempering means 103 may be Connected prior to the cleaning station 101 and directly behind the soldering apparatus 2, thereby cooling the assemblies which leave the soldering apparatus 2 as fast as possible and in a well defined manner to a certain temperature below the melting point of the solder, for instance to 175° C. For this purpose, a nozzle arrangement 104 may be provided in the tempering means 103 which sprays a heated fluid or a heated gas onto the assemblies. In this connection, the temperature of the medium to be sprayed should be preferably the same as the one of the cleansing fluid in the cleaning step 101, i.e. for instance 175° C. The medium emitted by the nozzle arrangement 104 is sprayed at a relatively low pressure in order to avoid a displacement of the assemblies on the printed circuit board since the temperature of the soldering joints can still be above the melting temperature of the solder when the soldered circuit boards enter the tempering means 103. Thus, the tempering means 103 allows the soldered circuit boards to be carefully and rapidly cooled to a temperature below the melting point of the solder. This guarantees that the components remain fixed on the circuit board and cannot be inadvertently removed in the subsequent cleaning station 101 by the cleansing fluid which is emitted by the nozzles 106 at a relatively high pressure.

The fluid used for the spraying in the tempering means 103 is preferably the same as the one used in the cleaning section 101. Consequently, no problems can arise due to unwanted mixing of the media. Since, as already explained above, the substance used as cleansing fluid is preferably the same as the one used as heat transfer medium in the vapor phase soldering apparatus 2, a continuous treatment path from the vapor phase soldering apparatus 2 via the tempering means 103 and the cleaning section 101 is obtained having a constant atmosphere so that mixing problems are excluded from the start.

The work pieces are transported through the cleaning section 101 and optionally through the tempering means 103 by a transport means 105, preferably on a horizontal transport path 4.

The work pieces are preferably tilted back and forth during the passage through the cleaning section 101 and optionally also in the region of the tempering means 103 and the drying section 107, thereby allowing the cleansing fluid and the soldering flux to flow off easily. Simultaneously, the direction of spray between the nozzles 106 and the work pieces varies in the cleaning section 101. This further improves the cleaning effect.

The exit side of the cleaning section 101 is provided with a lock gate 114a in order to minimize the outward flow of cleansing fluid when the printed circuit boards are carried out.

The cleaning section 101 should be suitably followed by a drying section 107, a cooling section 110 and/or a buffer section 111 so that the passing work pieces are cooled when they reach the output station 112. The drying process may be accelerated within the drying section 107 with the help of a circulation blower 108. In addition, cooling devices 109 or 109' may be provided in the drying section 107 and in the cooling section 110 in order to condense the evaporating medium. The work pieces are cooled in the cooling section 110 which follows the drying section 107 in the transport direction of the work pieces and are then supplied to the output station 112 via a buffer section 111. Due to this controlled cooling in the closed space of the cooling section 110 which is substantially free of ambient air, the soldering joints are prevented from unwanted oxidation, on account of the reduced temperature at the soldering joint. In addition, the lock assembly comprising the lock gates 114a to d substantially prevents cleansing fluid from flowing out. The cleansing fluid used in the various treatment sections (tempering means 103, cleaning section 101, drying section 107, cooling section 110 and buffer section 111) is again fed to the cleaning process via a recycling system (not shown).

The output station 112 can be provided with an exhaustion device 113 in order to exhaust and condense any Vapor remainders and feed them back to the cleaning process via the aforementioned recycling process.

As mentioned above, the various treatment sections are separated from each other by locks which only open if required, optionally by an automatic control. This substantially prevents the emission of the relatively expensive treatment media which may be harmful to the environment.

Since the apparatus according to the invention eliminates the need to use acids for removing solder residues, inexpensive aluminum plate can be employed for the construction of the housing instead of high-grade steel plate. In this connection, the aluminum plates can be screwed to each other. This allows an inexpensive and flexible manufacture of the whole assembly.

During the operation of a vapor phase soldering apparatus the further problem arises that the work pieces are very rapidly heated when they enter the treating chamber 201 and may be damaged since the heat transfer during the condensation of the heat transfer medium is very high. It is therefore proposed according to the invention to heat the work pieces in a controlled manner prior to supplying them to the treating chamber 201, 203, e.g. stepwise first to 180° C. and then to 120° C., for instance by means of a nozzle and atomizing device similar to the tempering means 103 of the cleaning apparatus 1 (which acts, however, opposite as a cooling section). In this connection, it should be noted that, according to the invention, this controlled heating prior to the vapor phase soldering can be performed with and without the described cleaning process.

I claim:

1. In a method for vapor phase soldering and removing solder residues from products after the soldering process, in particular from printed-board assemblies or circuit modules, the improvement comprising removing solder residues from the products by washing the products with an inert cleansing fluid which is maintained as a liquid at a temperature below the melting point of the solder, and that the fluid used as cleansing fluid is the same as the one used as a heat transfer medium during the vapor phase soldering.

2. The method according to claim 1, characterized in that the temperature of the inert cleansing fluid during washing is maintained within a range from 150° C. to 180° C.

3. The method according to claim 2 wherein the inert cleansing fluid during washing is maintained at a temperature of about 175° C.

4. The method according to claim 1, characterized in that the inert cleansing fluid is sprayed onto the products under pressure.

5. The method according to claim 1, characterized in that the inert cleansing fluid is sprayed onto the products from different angles.

6. The method according to claim 1, characterized in that the products are dried after the removal of the solder residues.

7. The method according to claim 6, characterized in that air is circulated in a drying station (107) for evaporating and precipitating the inert cleansing fluid.

8. The method according to claim 6, characterized in that the products are cooled after drying.

9. The method according to claim 1, characterized in that, prior to the cleaning, the products are treated with a spray of an inert tempering fluid at a temperature below the melting point of the solder.

10. The method according to claim 9, characterized in that the fluid used as inert tempering fluid for the spray is the same as the inert cleansing fluid.

11. The method according to claim 1, characterized in that the solder residues are removed in a continuous operation.

12. The method according to claim 1 wherein the temperature of the inert cleansing fluid during washing is slightly below the melting point of the solder.

13. The method according to claim 1 wherein solder residues are removed in a shuttle-type operation.

14. An apparatus for vapor phase soldering and for removing solder residues from products after the soldering process in a treatment station (201), characterized by a cleaning station (101) comprising several nozzle devices (106) directed to the products to be cleaned for spraying heat transfer medium as inert cleansing fluid and by a means for adjusting the temperature of the cleansing fluid at a value below the boiling point of the inert cleansing fluid and below the melting point of the solder.

15. The apparatus according to claim 14, characterized by a tempering means (103) preceding the cleaning station (101).

16. The apparatus according to claim 14, characterized by a drying station (107) subsequent to the cleaning station (101).

17. The apparatus according to claim 16, characterized in that the drying station comprises a circulation blower (108).

18. The apparatus according to claim 16, characterized in that the drying station (107) comprises at least one cooling device (109) for precipitating the inert cleansing fluid.

19. The apparatus according to claim 16, characterized in that the cleaning station (101) or the drying station (107) is followed by a cooling station (110).

20. The apparatus according to claim 19, characterized in that the cooling station (110) comprises a heat exchanger (109').

21. The apparatus according to claim 19, characterized in that the cooling station (110) is followed by a buffer station (111) in front of an output station (112).

22. The apparatus according to claim 21, characterized in that the output station (112) comprises an exhaustion device (113).

23. The apparatus according to claim 22, characterized in that it is designed as a continuous device.

24. The apparatus of claim 22 characterized in that it is designed as a shuttle-type device.

25. The apparatus of claim 14 wherein the means for adjusting the temperature of the inert cleansing fluid adjusts the temperature to a value slightly below the melting point of the solder.

26. The apparatus according to claim 14, characterized in that lock devices (114, 204) are provided between the various stations and at entrance and exit sides thereon.

27. The apparatus according to claim 26, characterized in that the lock device (204') between the treating chamber (201) and the cleaning station (101) is formed by a liquid curtain.

28. The apparatus according to claim 27, characterized in that a fluid which is compatible with the cleansing fluid and the heat transfer medium is used for the liquid curtain.

29. The apparatus according to claim 14, characterized in that the apparatus is housed in a housing which comprises aluminum plates which are screwed to each other.

* * * * *